United States Patent
Eggers et al.

(10) Patent No.: US 11,940,517 B2
(45) Date of Patent: Mar. 26, 2024

(54) MR IMAGING USING DIXON-TYPE WATER/FAT SEPARATION WITH SUPPRESSION OF FLOW-INDUCED LEAKAGE AND/OR SWAPPING ARTIFACTS

(71) Applicant: KONINKLIJKE PHILIPS N.V., Eindhoven (NL)

(72) Inventors: Holger Eggers, Veldhoven (NL); Christian Stehning, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 64 days.

(21) Appl. No.: 17/793,422

(22) PCT Filed: Jan. 25, 2021

(86) PCT No.: PCT/EP2021/051542
§ 371 (c)(1),
(2) Date: Jul. 18, 2022

(87) PCT Pub. No.: WO2021/151805
PCT Pub. Date: Aug. 5, 2021

(65) Prior Publication Data
US 2023/0038530 A1    Feb. 9, 2023

(30) Foreign Application Priority Data
Jan. 30, 2020   (EP) .................................... 20154518

(51) Int. Cl.
*G01R 33/48* (2006.01)
*G01R 33/561* (2006.01)
*G01R 33/563* (2006.01)

(52) U.S. Cl.
CPC ..... *G01R 33/4828* (2013.01); *G01R 33/5615* (2013.01); *G01R 33/56316* (2013.01)

(58) Field of Classification Search
CPC ............ G01R 33/4828; G01R 33/5615; G01R 33/56316; G01R 33/5608; G01R 33/5616; G01R 33/5673; G01R 33/56509
See application file for complete search history.

(56) References Cited

U.S. PATENT DOCUMENTS 10,175,330 B2    1/2019   Eggers et al.
2014/0368195 A1  12/2014   Eggers et al.
(Continued)

FOREIGN PATENT DOCUMENTS

EP    3413070 A1   12/2018

OTHER PUBLICATIONS

International Search Report and Written Opinion from PCT/EP2021/051542 dated Mar. 29, 2021.
(Continued)

*Primary Examiner* — G. M. A Hyder

(57) ABSTRACT

The invention relates to a method of Dixon-type MR imaging. It is an object of the invention to provide a method that enables efficient and reliable Dixon water/fat separation, in particular using a bipolar acquisition strategy, while avoiding flow-induced leakage and swapping artifacts. According to the invention, an imaging sequence is executed which comprises at least one excitation RF pulse and switched magnetic field gradients, wherein pairs of echo signals are generated at two different echo times (TE1, TE2) and during two or more different cardiac phases (AW1, AW2). The echo signals are acquired and phase images are reconstructed therefrom. A final diagnostic image is reconstructed from the echo signal data using water/fat separation, wherein regions of flow and/or or estimates of flow-induced phase errors are derived from the phase images to suppress or compensate for flow-induced leakage and/or swapping artifacts in the final diagnostic image. Therein, flow-induced phase offsets are determined by voxel-wise comparison of the phase (Continued)

images associated with the different cardiac phases. Moreover, the invention relates to a MR device (1) and to a computer program to be run on a MR device (1).

10 Claims, 3 Drawing Sheets

(56) References Cited

U.S. PATENT DOCUMENTS

2017/0234952 A1    8/2017  Zhang et al.
2017/0307715 A1*  10/2017  Eggers ............. G01R 33/56308
2018/0098711 A1    4/2018  Leporq et al.

OTHER PUBLICATIONS

Liu et al "Method of B0 Mapping with Magnitude-Based Correction for Bipolar Two-Point Dixon Cardiac MRI" Magnetic Resonance in Med. 78 p. 1862-1869 (2017).

Eggers et al "Dual-echo Dixon imaging with flexible choice of echo times" Magn. Reson Med. 6 p. 96-107 (2011).

Rahimi et al "Flow Induced Signal Misallocation Artifacts in Two-Point Fat-Water Chemical Shift MRI" Magn. Reson Med. 73 p. 1926-1931 (2015).

Zhang et al "Resolving Phase Ambiguity in Dual-Echo Dixon Imaging Using a Projected Power Method" Magnetic Reson. Med. vol. 77 No. 5 p. 2066-2076 (2016).

Schubert et al Flow-Induced Artifacts in two-point Dixon MRI Incidence Severity and Potential Diagnostic Pitfalls: Proc. of the Int. Soc. for Magnetic Reson. in Med. vol. 254 (2016).

* cited by examiner

MR IMAGING USING DIXON-TYPE WATER/FAT SEPARATION WITH SUPPRESSION OF FLOW-INDUCED LEAKAGE AND/OR SWAPPING ARTIFACTS

CROSS REFERENCE TO RELATED APPLICATIONS

This application is a U.S. national phase application of International Application No. PCT/EP2021/051542 filed on Jan. 25, 2021, which claims the benefit of EP Application Serial No. 20154518.3 filed on Jan. 30, 2020 and is incorporated herein by reference.

FIELD OF THE INVENTION

The invention relates to the field of magnetic resonance (MR) imaging. It concerns a method of MR imaging of an object placed in the examination volume of a MR device. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field $B_0$ whose direction at the same time defines an axis (normally the z-axis) of the co-ordinate system on which the measurement is based. The magnetic field $B_0$ produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) perpendicular to the z-axis, so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z-axis to the transverse plane (flip angle 90°).

After termination of the RF pulse, the magnetization relaxes back to the original state of equilibrium, in which the magnetization in the z direction is built up again with a first time constant $T_1$ (spin-lattice or longitudinal relaxation time), and the magnetization in the direction perpendicular to the z direction relaxes with a second time constant $T_2$ (spin-spin or transverse relaxation time). The variation of the magnetization can be detected by means of receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal in the receiving coils.

In order to realize spatial resolution in the body, constant magnetic field gradients extending along the three main axes are superposed on the uniform magnetic field $B_0$, leading to a linear spatial dependency of the spin resonance frequency. The signal picked up in the receiving coils then contains components of different frequencies which can be associated with different locations in the body. The signal data obtained via the receiving coils correspond to the spatial frequency domain and are called k-space data. The k-space data usually include multiple lines acquired with different phase encoding. Each k-space line is digitized by collecting a number of samples. A set of k-space data is converted to an MR image, e.g., by means of Fourier transformation.

In MR imaging, it is often desired to obtain information about the relative contribution of water and fat to the overall signal, either to suppress the contribution of one of them or to separately or jointly analyze the contribution of both of them. These contributions can be calculated if information from two or more corresponding echoes, acquired at different echo times, is combined. This may be considered as chemical shift encoding, in which an additional dimension, the chemical shift dimension, is defined and encoded by acquiring two or more MR images at slightly different echo times. For water/fat separation, these types of experiments are often referred to as Dixon-type of measurements. By means of Dixon MR imaging or Dixon water/fat MR imaging, a water/fat separation is achieved by calculating contributions of water and fat from two or more corresponding echoes, acquired at different echo times. In general such a separation is possible because there is a known precessional frequency difference of hydrogen in fat and water. In its simplest form, water and fat images are generated by either addition or subtraction of the 'in-phase' and 'out-of-phase' datasets.

Several Dixon-type MR imaging methods have been proposed in recent years. Apart from different strategies for the water/fat separation, the known techniques are mainly characterized by the specific number of echoes (or 'points') they acquire and by the constraints that they impose on the used echo times. Sampling two instead of three or more echoes is often desirable in terms of scan efficiency. Eggers et al. (Magn. Reson. Med., 65:96-107, 2011) have proposed a dual-echo flexible Dixon-type MR imaging method. Using such Dixon-type MR imaging methods with flexible echo times, in-phase and opposed-phase images are no longer necessarily acquired, but optionally synthesized from water and fat images.

Various strategies can be used in Dixon imaging for acquiring echo signals at two different echo times, including: (i) dual-pass strategies, wherein each echo signal is acquired separately after an excitation RF pulse using a positive amplitude readout magnetic field gradient, (ii) fly-back strategies, wherein both echo signals are acquired after the same excitation RF pulse using a positive amplitude readout magnetic field gradient in combination with a negative amplitude re-winder magnetic field gradient, and (iii) bipolar strategies, wherein both echo signals are acquired after the same excitation RF pulse, one echo being acquired using a positive amplitude readout magnetic field gradient and the other echo being acquired using a negative amplitude readout magnetic field gradient.

Flow is known to be a cause of artifacts in Dixon water/fat imaging. These artifacts result when the phase of the MR signal at a given voxel position accrues by moving water molecules and is misinterpreted by the Dixon reconstruction algorithm, such that a fraction of or even the full MR signal at that voxel position is inappropriately allocated to the fat image (so-called leakage or swapping artifacts).

Bipolar strategies permit reaching a high sampling efficiency, but they suffer from several phase errors. In particular, bipolar gradients are known to be flow sensitizing because they lead to a phase offset in the MR signal of moving spins proportional to their velocity in the direction of the readout magnetic field gradient. As mentioned above, such flow-induced phase offsets can be a source for undesired misallocations of MR signal to fat and water images (see Rahimi et al., Magn. Reson. Med., 73:1926-1931, 2015). Such artifacts are of particular concern in the MR imaging-based evaluation of blood vessels (MR angiography), since they may falsely suggest the presence of an intravascular clot or a higher severity of a stenosis.

U.S. Pat. No. 10,175,330 B2 discloses a method of MR imaging that enables efficient compensation of flow artifacts for MR angiography in combination with Dixon water/fat separation. MR echo signals are acquired at two or more different echo times using a conventional Dixon technique, and single-echo MR images are reconstructed from the acquired MR echo signals, one for each of the two or more echo times. Blood vessels are extracted from the single-echo MR images using image segmentation to suppress artifacts in the water/fat separation arising from the application of Dixon methods in the presence of flow.

It is thus an object of the invention to provide a method that enables efficient and reliable Dixon water/fat separation, in particular using a bipolar acquisition strategy, while avoiding flow-induced leakage and swapping artifacts.

SUMMARY OF THE INVENTION

In accordance with the invention, a method of MR imaging of an object placed in an examination volume of a MR device is disclosed. The method comprises the following steps:
subjecting the object to an imaging sequence, which comprises at least one excitation RF pulse and switched magnetic field gradients, wherein pairs of echo signals are generated at two different echo times and during two or more different cardiac phases;
acquiring the echo signals from the object;
reconstructing phase images from the acquired echo signal data; and
reconstructing a final diagnostic image from the echo signal data using water/fat separation, wherein regions of flow and/or estimates of flow-induced phase errors are derived from the phase images to suppress or compensate for flow-induced leakage and/or swapping artifacts in the final diagnostic image.

According to the invention, dual-echo Dixon MR imaging is performed. Pairs of echo signals are acquired, wherein the first echo signal of each pair is associated with a first echo time while the second echo signal of each pair is associated with a second echo time that is different from the first echo time. A number of such pairs is acquired with different phase encodings to sample a given k-space region according to the respective imaging task. This means that both echo signals of each pair share the same phase encoding and each pair of echo signals is assigned one specific phase encoding. The essential feature of the invention is that the acquisition of each pair of echo signals is repeated during two or more different phases of the cardiac cycle. This means, in other words, that the k-space region is sampled at least twice, namely once for each of the two or more different cardiac phases. As a result, one set of echo signal pairs is assigned one cardiac phase, another set of echo signal pairs is assigned another cardiac phase. A phase image is then reconstructed for each echo time and for each cardiac phase. The variation in the velocity of blood flow over the cardiac cycle is reflected in local phase offsets between the phase images associated with the different cardiac phases. This enables the localization of relevant blood flow, the estimation of corresponding phase errors, and the suppression of leakage and swapping artifacts caused by it. The phase images associated with different echo times, together with the corresponding magnitude images, are the basis for reconstructing the final diagnostic image, which may be a water image or a fat image, i.e., an MR image showing only signal contributions from water or fat, respectively, using a two-point Dixon algorithm for the water/fat separation. Flow-induced artifacts are suppressed therein by taking the determined regions of flow and/or the estimated phase errors into account, e.g. by appropriately removing the flow-induced phase offsets in the corresponding areas of the single-echo phase images prior to the water/fat separation. The result is a diagnostic (water or fat) image of high quality with a significantly reduced level of flow-induced leakage or swapping artifacts.

In a preferred embodiment, the pairs of echo signals are generated after different temporal delays after detection of a cardiac trigger signal. Cardiac triggering may be achieved, e.g., by additional acquisition of an ECG signal. The different cardiac phases can be selected by choosing appropriate trigger delays. These choices may be based on prior knowledge of the temporal variation in the blood flow over the cardiac cycle, or on a suitable calibration measurement that provides quantitative information on the velocity of the blood flow in selected vessels. The latter variant may also be used to trade off the expected cardiac motion and blood flow. For static MR imaging of the heart or thorax, the acquisition of two or more pairs of echo signals during each cardiac cycle will entail no increase in scan time, since cardiac triggering has to be applied anyway and the signal acquisition is typically restricted to only a fraction of the cardiac cycle to avoid artifacts caused by cardiac motion.

In a further preferred embodiment, the pairs of echo signals are acquired using bipolar readout magnetic field gradients. Like in a conventional bipolar acquisition strategy, the two echo signals of each pair are acquired using a corresponding pair of temporally adjoining readout magnetic field gradients having opposed polarities. The first echo is acquired at the first echo time using a positive amplitude readout magnetic field gradient and the second echo is acquired at the second echo time using a negative amplitude readout magnetic field gradient (or vice versa).

According to yet another preferred embodiment, the regions of flow are determined from the phase images by image processing techniques such as masking, thresholding or segmentation.

In yet further preferred embodiments, the redundant information contained in the echo signals generated during different cardiac phases are used for noise reduction by averaging in the step of reconstructing the diagnostic image. Moreover, a flow velocity map can be derived from the phase images to support the derivation of useful quantitative parameters, such as stroke volume.

The invention thus proposes a suppression of flow-induced leakage and swapping artifacts in bipolar dual-echo Dixon imaging by acquisition of pairs of echo signals in different cardiac phases. Undesirable signal swaps or misallocations due to flow are significantly reduced by the method of the invention.

The method of the invention described thus far can be carried out by means of a MR device including at least one main magnet coil for generating an essentially uniform, static magnetic field $B_0$ within an examination volume, a number of gradient coils for generating switched magnetic field gradients in different spatial directions within the examination volume, at least one body RF coil for generating RF pulses within the examination volume and/or for receiving MR signals from a body of a patient positioned in the examination volume, a control unit for controlling the temporal succession of RF pulses and switched magnetic field gradients, and a reconstruction unit for reconstructing MR images from the received MR signals. The method of the invention can be implemented by a corresponding programming of the reconstruction unit and/or the control unit of the MR device.

The method of the invention can be advantageously carried out on most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention.

In the drawings.

DETAILED DESCRIPTION OF THE EMBODIMENTS

Figure 1:
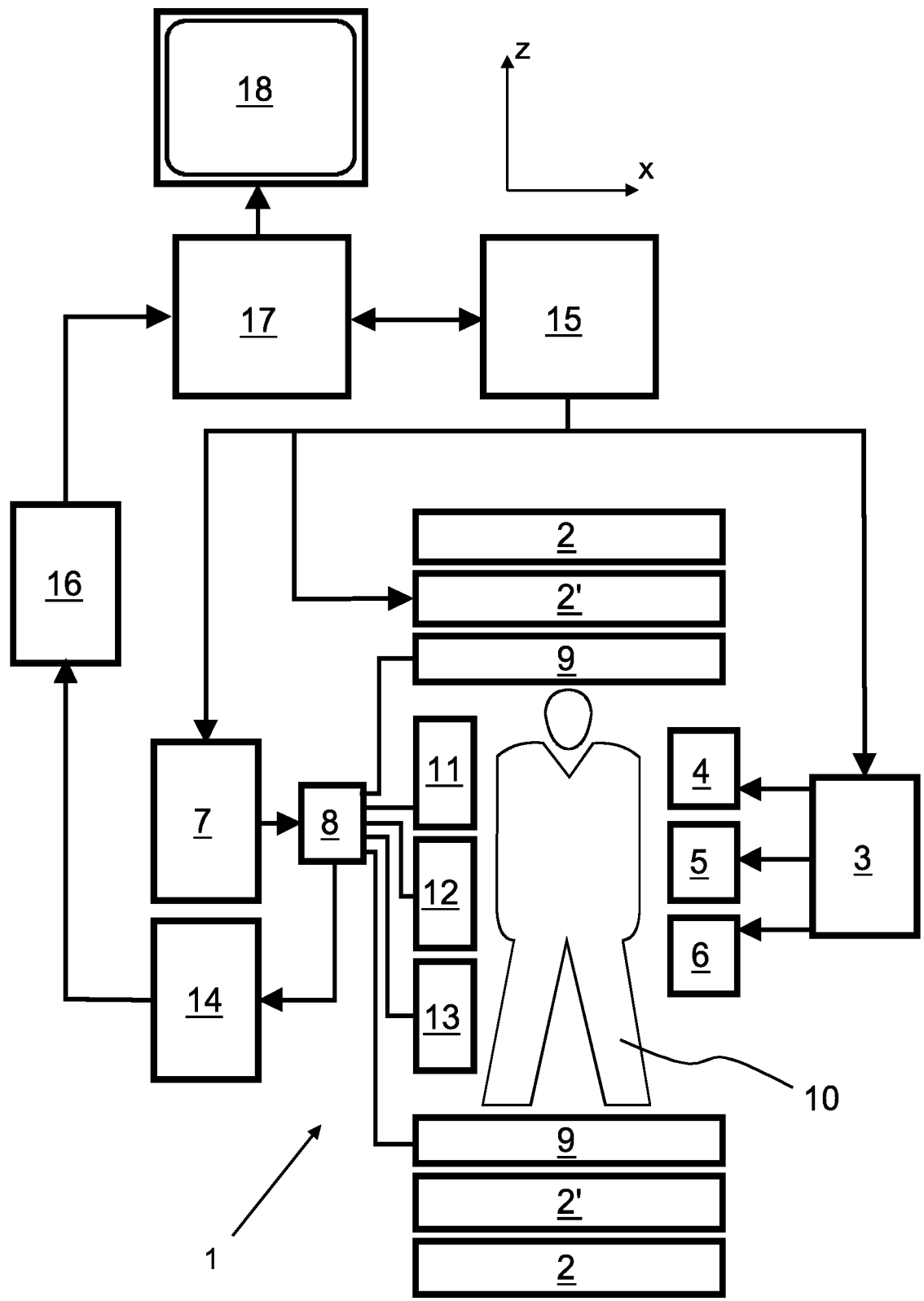
FIG. 1 shows a MR device for carrying out the method of the invention.

With reference to FIG. 1, a MR device 1 is shown as a block diagram. The device comprises superconducting or resistive main magnet coils 2 such that a substantially uniform, temporally constant main magnetic field $B_0$ is created along a z-axis through an examination volume. The device further comprises a set of ($1^{st}$, $2^{nd}$, and—where applicable—$3^{rd}$ order) shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send/receive switch 8, to a body RF coil 9 to transmit RF pulses into the examination volume. A typical MR imaging sequence is composed of a packet of RF pulse segments of short duration which, together with any applied magnetic field gradients, achieve a selected manipulation of nuclear magnetic resonance. The RF pulses are used to saturate magnetic resonance, excite magnetic resonance, invert magnetization, refocus magnetic resonance, or manipulate magnetic resonance. In particular, they are used to select a portion of a body 10 positioned in the examination volume. The 1\4R signals are also picked up by the body RF coil 9.

For generation of MR images of limited regions of the body 10, a set of local array RF coils 11, 12, 13 are placed contiguous to the region selected for imaging. The array coils 11, 12, 13 can be used to receive MR signals induced by RF transmissions via the body RF coil.

The resultant MR signals are picked up by the body RF coil 9 and/or by the array RF coils 11, 12, 13 and demodulated by a receiver 14 preferably including a preamplifier (not shown). The receiver 14 is connected to the RF coils 9, 11, 12 and 13 via the send/receive switch 8.

A host computer 15 controls the shimming coils 2' as well as the gradient pulse amplifier 3 and the transmitter 7 to generate the imaging sequences of the invention. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data are reconstructed into an image representation by a reconstruction processor 17 which applies a Fourier transform or other appropriate reconstruction algorithms, such as SENSE. The MR image may represent a planar slice through the patient, an array of parallel planar slices, a three-dimensional volume, or the like. The image is then stored in an image memory where it may be accessed for converting slices, projections, or other portions of the image representation into an appropriate format for visualization, for example via a video monitor 18 which provides a man-readable display of the resultant MR image.

The host computer 15 and the reconstruction processor 17 are programmed to execute the method of the invention as described above and in the following.

Figure 2:
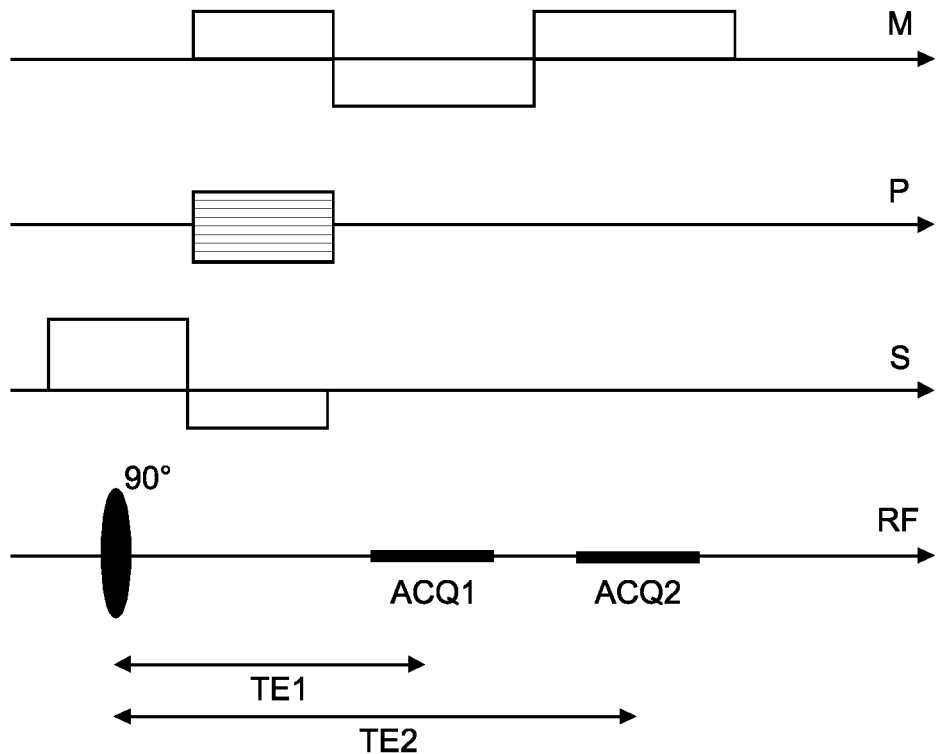
FIG. 2 shows a schematic (simplified) pulse sequence diagram of a Dixon imaging sequence using bipolar readout magnetic field gradients according to the invention.

In FIG. 2, a schematic pulse sequence diagram of a Dixon imaging sequence using bipolar readout magnetic field gradients according to the invention is depicted. The diagram shows switched magnetic field gradients in the frequency-encoding direction (M), the phase-encoding direction (P) and the slice-selection direction (S). Moreover, the diagram shows an RF excitation pulse as well as the time intervals during which echo signals are acquired, designated by ACQ1 and ACQ2. The diagram covers the acquisition of one pair of echo signals. A number of such pairs of echo signals is acquired by multiple repetitions of the depicted sequence using different phase encodings (P) to completely cover the required region of k-space. Each pair of echo signals is acquired using a corresponding pair of readout magnetic field gradients (M) having opposed polarities. The timing and amplitudes of the bipolar readout gradients are chosen to shift the acquisition windows ACQ1, ACQ2 of the echo signals such that different echo times TE1 and TE2 and correspondingly different phase offsets of the signal contributions from water protons and fat protons are provided. The Dixon-type separation of these signal contributions is based on these phase offsets in the final step of the reconstruction of a diagnostic water or fat image.

Figure 3:
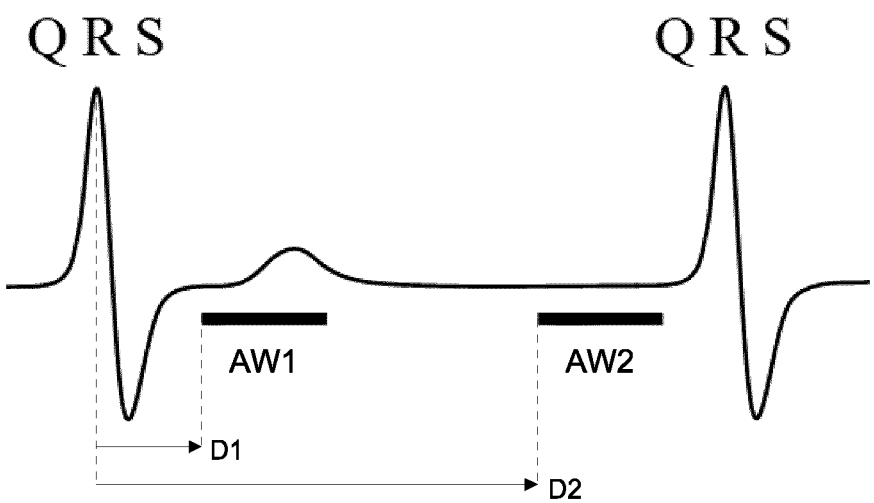
FIG. 3 illustrates the cardiac triggering in accordance with the invention.

According to the invention, the acquisition of each pair of echo signals is repeated during two or more different phases of the cardiac cycle. This is illustrated in FIG. 3. Two consecutive QRS complexes of an ECG signal acquired from the body 10 of the patient are shown. Two acquisition windows AW1 and AW2 are indicated that are associated with different cardiac phases. The acquisition of a pair of echo signals is performed once for each acquisition window AW1, AW2. In practice, the pairs of echo signals are acquired after different temporal delays after detection of a cardiac trigger signal (e.g. the R-peak of the ECG-signal). The different cardiac phases are selected by choosing appropriate trigger delays. The corresponding two trigger delays D1 and D2 are indicated in FIG. 3.

Figure 4:
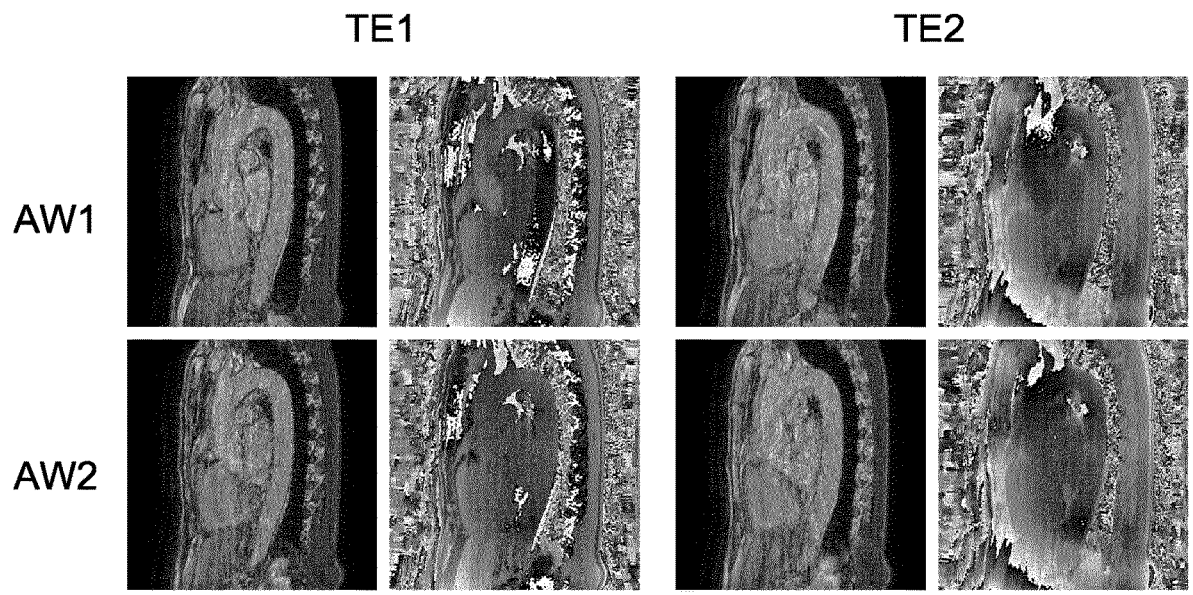
FIG. 4 shows magnitude and phase images associated with different echo times and different cardiac phases.

According to the invention, phase images are reconstructed from the acquired echo signal data. One phase image is reconstructed for each echo time TE1, TE2 and acquisition window AW1, AW2. A set of corresponding images of the thorax region is shown in FIG. 4. Magnitude (left) and phase (right) images for the two cardiac phases associated with the two acquisition windows AW1, AW2 (rows) and for the two echo times TE1, TE2 (columns) are provided. In the depicted embodiment, the velocity of the blood flow in the aorta is close to the maximum in the first selected cardiac phase (AW1) and close to the minimum in the second selected cardiac phase (AW2). Accordingly, flow-induced phase offsets are substantially larger at the first echo time TE1.

Differences in the phase images for one cardiac phase AW1, AW2 (i.e., phase images of one row in FIG. 4) reflect main magnetic field inhomogeneity, chemical shift, and flow, while differences in the phase images at one echo time TE1 or TE2 (i.e., phase images of one column in FIG. 4) mainly arise from flow only. Actually, differences in the phase images at one echo time are primarily seen at the first echo time TE1, due to the so-called even-echo rephasing effect. Any significant motion between the phase images may be corrected in a conventional fashion, e.g. using registration based on the corresponding magnitude images.

For the localization of relevant blood flow, i.e. of blood flow in the frequency encoding direction, it can be advantageous to first eliminate chemical shift-induced phase offsets that are consistent in the phase images of all cardiac phases (AW1, AW2). This may be achieved by separately applying a water/fat separation to the images of each cardiac phase. Alternatively, phase difference images may be calculated directly from the phase images at each echo time TE1, TE2.

Figure 5:
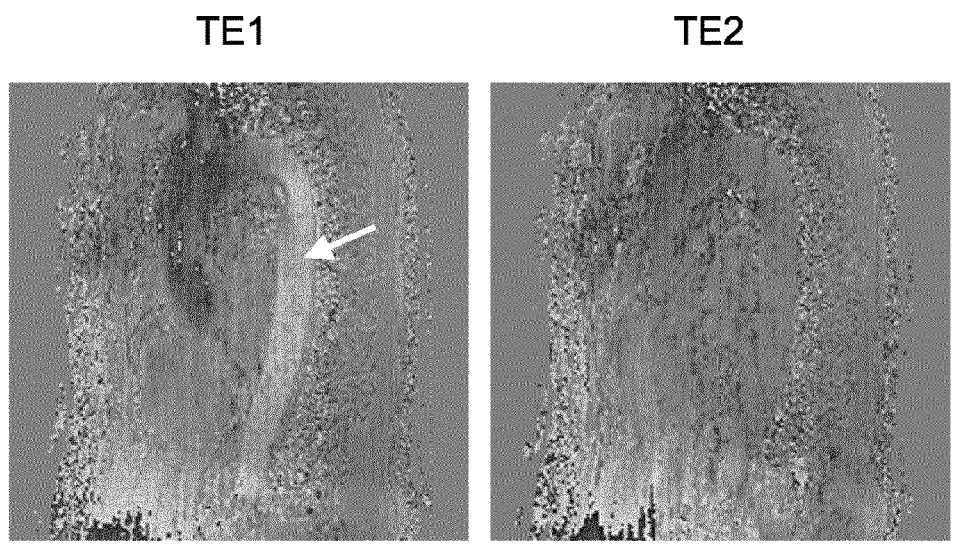
FIG. 5 shows phase difference images associated with different cardiac phases.

Phase difference images derived from the phase images in FIG. 4 are shown in FIG. 5. The phase difference image associated with the first echo time TE1 allows a localization of relevant blood flow in the aorta (indicated by white arrow), for instance by masking, thresholding, segmentation, or the like. Finally, a diagnostic image is reconstructed involving water/fat separation. Therein, a suppression of leakage and swapping artifacts is achieved by either removing the flow-induced phase offsets in the determined regions prior to the water/fat separation, or by constraining the water/fat separation algorithm such that the blood signal is automatically allocated to the water signal in the determined regions of flow. The latter approach may involve reducing or removing any spatial smoothing of the estimated main field inhomogeneity in the water/fat separation, for instance selectively across the boundaries of these regions. The result of this procedure is a diagnostic (water or fat) image of high quality with a significantly reduced level of flow-induced leakage or swapping artifacts.

The invention claimed is:

1. A method of magnetic resonance (MR) imaging of a body of a patient placed in an examination volume of a MR device, the method comprising:
    subjecting the body to an imaging sequence, which comprises at least one excitation RF pulse and switched magnetic field gradients, wherein a number of pairs of echo signals is generated at two different echo times (TE1, TE2) with different phase encodings to sample a region of k-space, and wherein the generation of each pair of echo signals is repeated during two or more different cardiac phases (AW1, AW2);
    acquiring the echo signals from the body;
    reconstructing phase images from the acquired echo signal data, wherein a phase image is reconstructed for each echo time and for each cardiac phase; and
    reconstructing a final diagnostic image from the echo signal data using water/fat separation, wherein regions of at least one of flow or estimates of flow-induced phase errors are derived from the phase images to suppress or compensate for flow-induced leakage and/or swapping artifacts in the final diagnostic image.

2. The method of claim 1, wherein the pairs of echo signals are generated after different delays (D1, D2) after detection of a cardiac trigger signal.

3. The method of claim 1, wherein the pairs of echo signals are acquired using bipolar readout magnetic field gradients (M).

4. The method of claim 1, wherein the regions of the at least one of flow or flow-induced phase errors are determined by voxel-wise comparison of phase images associated with different cardiac phases.

5. The method of claim 4, wherein the regions of flow are determined by an image processing technique including at least one selected from masking, thresholding or segmentation.

6. The method of claim 1, wherein the echo signals generated during different cardiac cycles are used for averaging in the step of reconstructing the diagnostic image.

7. The method of claim 1, wherein a flow velocity map is derived from local phase offsets in the phase images.

8. The method of claim 1, wherein the water/fat separation involves a two-point Dixon technique.

9. A magnetic resonance (MR) device comprising at least one main magnet coil for generating a uniform, static magnetic field $B_0$ within an examination volume, a number of gradient coils for generating switched magnetic field gradients in different spatial directions within the examination volume, at least one RF coil for generating RF pulses within the examination volume and/or for receiving MR signals from a body of a patient positioned in the examination volume, a control unit for controlling the temporal succession of RF pulses and switched magnetic field gradients, and a reconstruction unit for reconstructing MR images from the received MR signals, wherein the MR device is configured to perform a method including:

subjecting the body to an imaging sequence, which comprises at least one excitation RF pulse and switched magnetic field gradients, wherein a number of pairs of echo signals is generated at two different echo times (TE1, TE2) with different phase encodings to sample a region of k-space, and wherein the generation of each pair of echo signals is repeated during two or more different cardiac phases (AW1, AW2);

acquiring the echo signals from the body;

reconstructing phase images from the acquired echo signal data, wherein a phase image is reconstructed for each echo time and for each cardiac phase; and reconstructing a final diagnostic image from the echo signal data using water/fat separation, wherein regions of at least one of flow or estimates of flow-induced phase errors are derived from the phase images to suppress or compensate for flow-induced leakage and/or swapping artifacts in the final diagnostic image.

10. A computer program to be run on a magnetic resonance (MR) device, which computer program comprises instructions for:

executing an imaging sequence, which comprises at least one excitation RF pulse and switched magnetic field gradients so as to generate a number of pairs of echo signals at two different echo times (TE1, TE2) with different phase encodings to sample a region of k-space, with the generation of each pair of echo signals being repeated during two or more different cardiac phases (AW1, AW2);

acquiring the echo signals;

reconstructing phase images from the acquired echo signal data, wherein a phase image is reconstructed for each echo time and for each cardiac phase; and reconstructing a final diagnostic image from the echo signal data using water/fat separation, wherein regions of at least one of flow or estimates of flow-induced phase errors are derived from the phase images to suppress or compensate for flow-induced leakage and/or swapping artifacts in the final diagnostic image.

* * * * *